United States Patent
Lai et al.

(10) Patent No.: US 11,733,724 B2
(45) Date of Patent: Aug. 22, 2023

(54) DIGITAL LOW-DROPOUT VOLTAGE REGULATOR

(71) Applicant: Taiwan Semiconductor Manufacturing Company, Ltd., Hsinchu (TW)

(72) Inventors: Po-Yu Lai, Hsinchu (TW); Szu-Chun Tsao, Hsinchu (TW); Jaw-Juinn Horng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 165 days.

(21) Appl. No.: 17/407,926

(22) Filed: Aug. 20, 2021

(65) Prior Publication Data

US 2023/0053710 A1    Feb. 23, 2023

(51) Int. Cl.
| | |
|---|---|
| *H01L 23/522* | (2006.01) |
| *G05F 1/56* | (2006.01) |
| *H01L 21/8238* | (2006.01) |
| *H01L 27/092* | (2006.01) |
| *H01L 29/417* | (2006.01) |

(52) U.S. Cl.
CPC ............ *G05F 1/56* (2013.01); *H01L 23/5226* (2013.01); *H01L 21/8238* (2013.01); *H01L 27/092* (2013.01); *H01L 29/417* (2013.01)

(58) Field of Classification Search
CPC . G05F 1/56; G05F 1/575; G05F 1/565; G05F 1/468; G05F 1/59; G05F 1/46; G05F 1/262; H01L 21/8238; H01L 21/823871; H01L 21/823885; H01L 23/5226; H01L 23/5286; H01L 27/092; H01L 29/41725; H01L 29/417; H01L 29/41
See application file for complete search history.

(56) References Cited

U.S. PATENT DOCUMENTS

| 11,327,514 B2* | 5/2022 | Branca | ............... H05B 45/3725 |
| 2014/0062436 A1* | 3/2014 | Lenz | ......................... G05F 1/46 |
| | | | 323/282 |
| 2018/0151562 A1* | 5/2018 | Kundu | ................ H01L 29/4966 |
| 2020/0242294 A1* | 7/2020 | Chen | .................. G06F 30/3953 |
| 2022/0058326 A1* | 2/2022 | Lee | ...................... H01L 27/0207 |
| 2022/0058331 A1* | 2/2022 | Lim | ..................... H01L 27/0207 |

* cited by examiner

*Primary Examiner* — Thienvu V Tran
*Assistant Examiner* — Shahzeb K Ahmad
(74) *Attorney, Agent, or Firm* — Merchant & Gould P.C.

(57) ABSTRACT

In some embodiments, an integrated circuit device includes multiple rows of functional cells, with each row having a cell height. At least one of rows of functional cells includes at least one digital low-dropout voltage regulator (DLVR) cell with the cell height for the row. The DLVR cell includes: an input terminal, an output terminal, a voltage supply terminal, a reference voltage terminal, and one or more pairs of transistors. Each pair of transistors are arranged in cascode configuration connected between the voltage supply terminal and output terminal. The gate of one of the transistors the cascode configuration is connected to the input terminal, and the gate of the other transistor in the cascode configuration is connected to the reference voltage terminal. The four terminals each comprises a metal track in the bottom metal layer and disposed within the cell height.

20 Claims, 8 Drawing Sheets

DIGITAL LOW-DROPOUT VOLTAGE REGULATOR

BACKGROUND

This disclosure relates generally to design and fabrication of integrated circuits, and more specifically to digital low-dropout voltage regulators used in integrated circuits.

Certain integrated circuit devices, such as application processors, require regulated voltages of various levels. Digital low-dropout voltage regulators (DLVRs) are used to provide such regulated voltages in certain applications due at least in part to the high efficiency such regulators possess. Efforts are ongoing in improving the performance and efficiency of DLVRs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
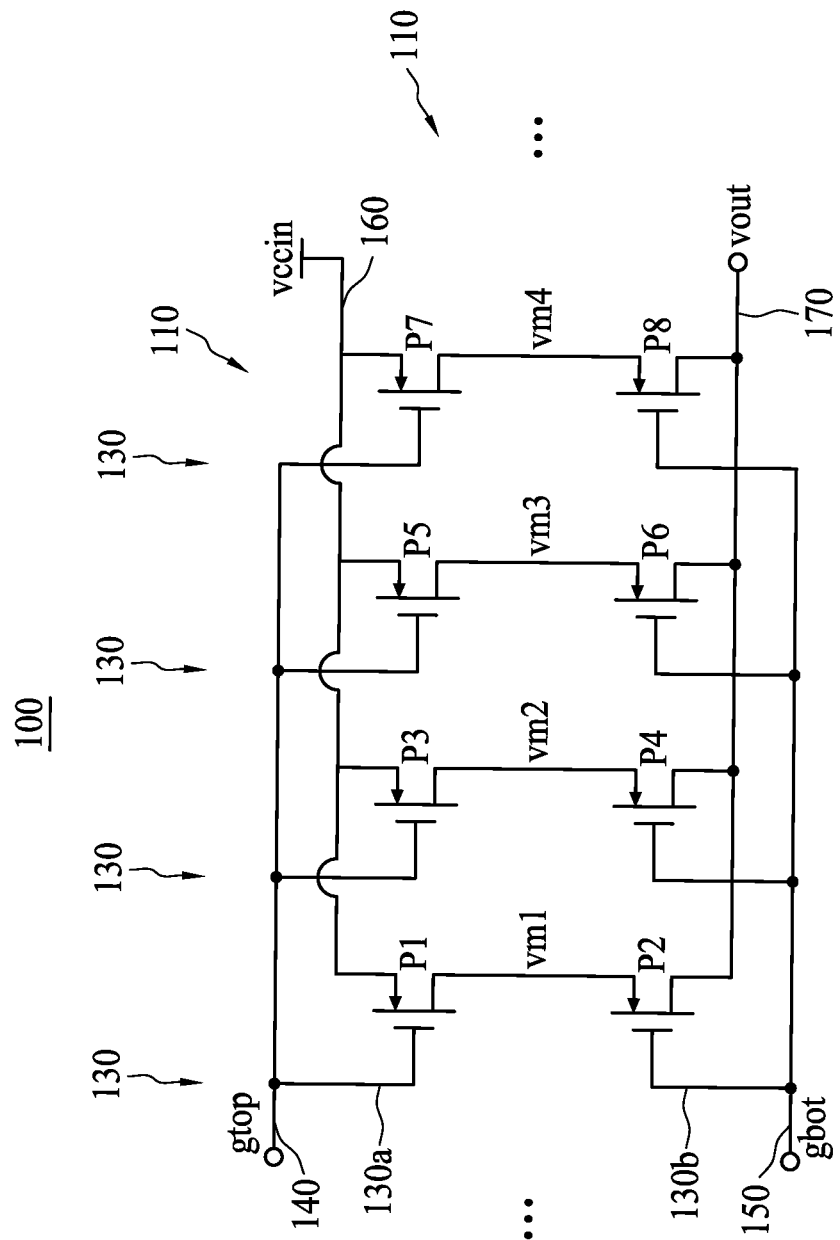
FIG. 1A shows a schematic circuit diagram of a digital low-dropout voltage regulator (DLVR) according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Certain integrated circuit (IC) devices, such as application processors, require supplies of regulated voltages at various levels. Digital low-dropout voltage regulators (DLVRs) are suitable voltage regulators in certain applications due, at least in part, to their high efficiency. A DLVR in some embodiments includes a DLVR driver contained in a unit cell, such as a functional cell in the active layer of an IC device. To have efficient and precise driving capability, a DLVR driver should be capable of delivering a high current density, which, in turn, requires a low-resistance ($R_{on}$). In some embodiments disclosed herein optimized or improved performance of DLVRs is provided by appropriate sizing and placement of the active region in a functional cell of an IC device and the metal layers, with the associated conductive pillars (VIAs), that apply an input voltage to, and provide output voltage from, each DLVR.

In some embodiments, an integrated circuit device includes multiple rows of functional cells, such as digital logic cells and memory cells, with each row having a cell height. At least one of rows of functional cells includes at least one digital low-dropout voltage regulator (DLVR) cell with the cell height for the row. The at least one DLVR cell includes: an input terminal, an output terminal, a voltage supply terminal, a reference voltage terminal, and one or more pairs of first and second transistors arranged in a cascode configuration connected between the voltage supply terminal and output terminal, with the gate of the first transistor in each pair connected to the voltage supply terminal connected to the input terminal, and the gate of the second transistor in each pair connected to the reference voltage terminal.

In some embodiments, a DLVR cell includes an active region, sometimes referred to as a "diffusion" region, with a height that is substantially smaller than the height of the cell it resides in. For example, the height of diffusion region is between 35-65% of the cell height in some embodiments, between 40-60% in other embodiments, between 45-55% in other embodiments, and approximately 50% in other embodiments. The diffusion region includes multiple segments, each of which corresponding to a transistor, such as a metal-oxide-semiconductor field-effect transistor (MOSFET); each segment has a channel region, and source and drain regions, one on each side of the channel region. The DLVR cell in some embodiments further includes gate lines, such as polysilicon ("poly") lines, disposed above the channel regions and separated from them by an insulating layer. The DLVR in some embodiments further includes multiple conductive (e.g., metallic) lines disposed in a first conductive layer above the gate lines and within the cell height. At least a first one of the conductive lines (input line) is connected (e.g., by one or more vis) to at least one of the gate lines; at least a second one of the conductive lines (voltage reference line) is connected to at least another one of the gate lines; at least the third one of the conductive lines (voltage supply line) is connected to at least a source or drain region of a first one of the transistors; and at least a fourth one of the conductive lines (output line) is connected to at least a drain or source region of a second one of the transistors. In some embodiments, the first and second transistors are arranged in a cascode configuration connected between the voltage supply line and output line.

In some embodiments, additional layers of conductive lines are disposed above the first conductive layer that. At least a first conductive path (voltage supply path) between a conductive line in the top one of the layers of conductive lines and the voltage supply line is formed by at least one conductive line from each layer intervening the top and first layer and vias interconnecting the respective conductive lines in neighboring layers. At least a second conductive path (output path) between a conductive line in the top one of the layers of conductive lines and the output line is formed by at least one conductive line from each layer intervening the top and first layer and vias interconnecting the respective conductive lines in neighboring layers. In some embodiments, the vias in the voltage supply path overlap each other when viewed along a direction substantially perpendicular to the layers of conductive lines; likewise, the vias in the output path overlap each other when viewed along a direction substantially perpendicular to the layers of conductive lines. In some embodiments, the vias in at least a substantial portion (such as at least four or five layers) of each of the conductive paths completely are substantially aligned with each other a long a common axis. In some embodiments, cross-sectional dimensions of the vias in each of the conductive paths monotonically increase or remain the same from the lower layers of conductors to the higher layers of conductors.

In some embodiments, the first layer of conductive lines includes multiple reference voltage lines, which are connected to each other by one or more conductive lines in one of the additional layers of conductive lines. One of the reference voltage lines is interposed between the voltage supply line and output line. The minimum permitted spacing between the voltage supply line and the interposed voltage reference line is smaller than the minimum permitted spacing between the voltage supply line and the output line without any intervening conductive line.

Referring to FIG. 1A, in some embodiments, an integrated circuit device 100 includes multiple rows 102 of functional cells, such as digital logic cells and memory cells, with each row having a cell height. At least one of rows 102 of functional cells includes at least one digital low-dropout voltage regulator (DLVR) cell 110 with the cell height for the row. In this example, the DLVR cell 110 includes: an input terminal 140, an output terminal 170, a voltage supply terminal 160, a reference voltage terminal 150, and one or more pairs of transistors (P1, P2), (P3, P4), (P5, P6), (P7, P8). Each pair of transistors (e.g., P1 and P2) are arranged in cascode configuration connected between the voltage supply terminal 160 and output terminal 170, i.e., with the drain of P1 connected to source of P2, source of P1 connected to the voltage supply terminal 160, and drain of P2 connected to the output terminal 170. The gates 130a of the transistors P1, P3, P5, P7 in this example are connected to the input terminal 140, and the gates 130b of the transistors P2, P4, P6, P8 are connected to the reference voltage terminal 150.

Figure 1B:
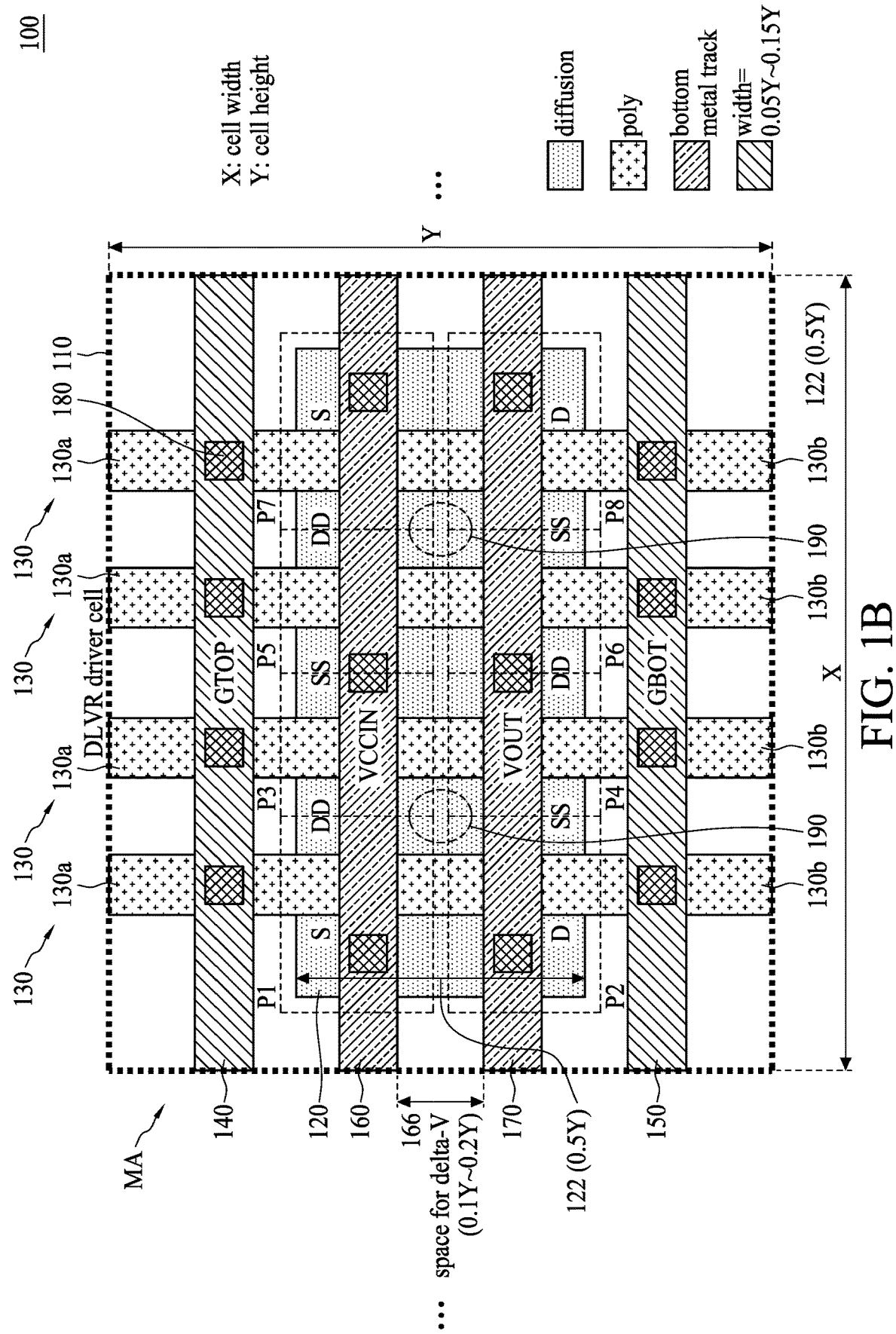
FIG. 1B schematically shows the active layer and the bottom metal layer contained within a functional cell in a physical layout of a digital low-dropout voltage regulator (DLVR) of the kind shown in FIG. 1A in an integrated circuit device according to some embodiments.

In some embodiments, a DLVR cell 110 shown in FIG. 1A is physically constructed as depicted in FIG. 1B. In this example, the DLVR cell 110 includes an active region, sometimes referred to as a "diffusion" region 120, with a height 122 that is substantially smaller than the height Y of the cell it resides in. For example, the height 122 of diffusion region can be between 35-65% of the cell height Y in some embodiments, between 40-60% in certain other embodiments, between 45-55% in certain other embodiments, and approximately 50% in certain other embodiments. The diffusion region 120 includes multiple segments, each of which corresponding to a transistor P1-P8. The transistors in some embodiments are a metal-oxide-semiconductor field-effect transistor (MOSFET). For example, the transistor can be fin-field-effect transistors (finFETs) or planar MOSFETs. In the example of finFETs in some embodiments, the diffusion region 120 include semiconductor fins running in the horizontal (X) direction. Each segment of the diffusion region includes a channel region (not shown), and source and drain regions (S, D, respectively), one on each side of the channel region. The DLVR cell 110 in some embodiments further includes gate lines, such as polysilicon ("poly") lines 130, disposed above the channel regions and separated from them by an insulating layer (not shown). Each gate line 130 in some embodiments is divided into two segments 130a, 130b disjointed from each other. The DLVR cell 110 in some embodiments further includes multiple (in this example, four) conductive (e.g., metallic) lines 140, 150, 160, 170 disposed in a first conductive layer MA above the gate lines 130 and within the cell height Y. In this example, a first one of the conductive lines (input line 140) is connected (e.g., by one or more vias 180) to at least one of the gate lines 130a; a second one of the conductive lines (voltage reference line 150) is connected to at least another one of the gate lines 130b; the third one of the conductive lines (voltage supply line 160) is connected to at least a source or drain region of a first one of the transistors (for example, sources (S) of transistors P1, P3, P5, P7) through vias 180 and source/drain metal contacts (sometimes denoted as "MD") (not shown); and fourth one of the conductive lines (output line 170) is connected to at least a drain or source region of a second one of the transistors (for example, drains (D) of transistors P2, P4, P6, P8) through vias 180 and source/drain metal contacts ("MD") (not shown). In some embodiments, at least the voltage supply line 160 and output line 170 are disposed within the height 122 of the diffusion region 120.

In this example, each pair of transistors (P1, P2), (P3, P4), (P5, P6), (P7, P8) are arranged in a cascode configuration connected between the voltage supply line 160 and output line 170. For example, the drain (D) of transistor P1 and the source (S) of the transistor P2 are connected to each other by, for example, source/drain contact layer (MD 190 (not depicted explicitly)); the source (S) of transistor P1 is connected to the voltage supply line 160 by a via 180; the drain (D) of transistor P2 is connected to the output line 170 by a via 180.

The widths and placement of the conductive lines 140, 150, 160, 170 within a cell height are selected in some embodiments subject to certain design rules. For example, while a wider conductive line width may be desirable to reduce resistance, the line width is limited by certain requirements for minimum inter-line distance corresponding to the anticipated voltage difference ($\Delta V$) between two neighboring conductive lines. For example, in the layout shown in FIG. 1B, if the voltage supply line 160 is biased at a voltage, VCCIN, of 1.65 V, the reference voltage line 150 is set at 0.5×VCCIN, and the input line is set at a voltage varying in a range of 0.5×VCCIN to VCCIN, the output voltage, VOUT, at the output line 170 is expected to vary between 0 and 1.55 V. Under these conditions (a $\Delta V$ of up to 1.55 V), the spacing 166 between the voltage supply line 160 and output line 170 is set in a range of 0.1Y and 0.2Y, and the widths of the conductive lines 140, 150, 160, 170 are set in a range of 0.05Y to 0.15Y.

Figure 2:
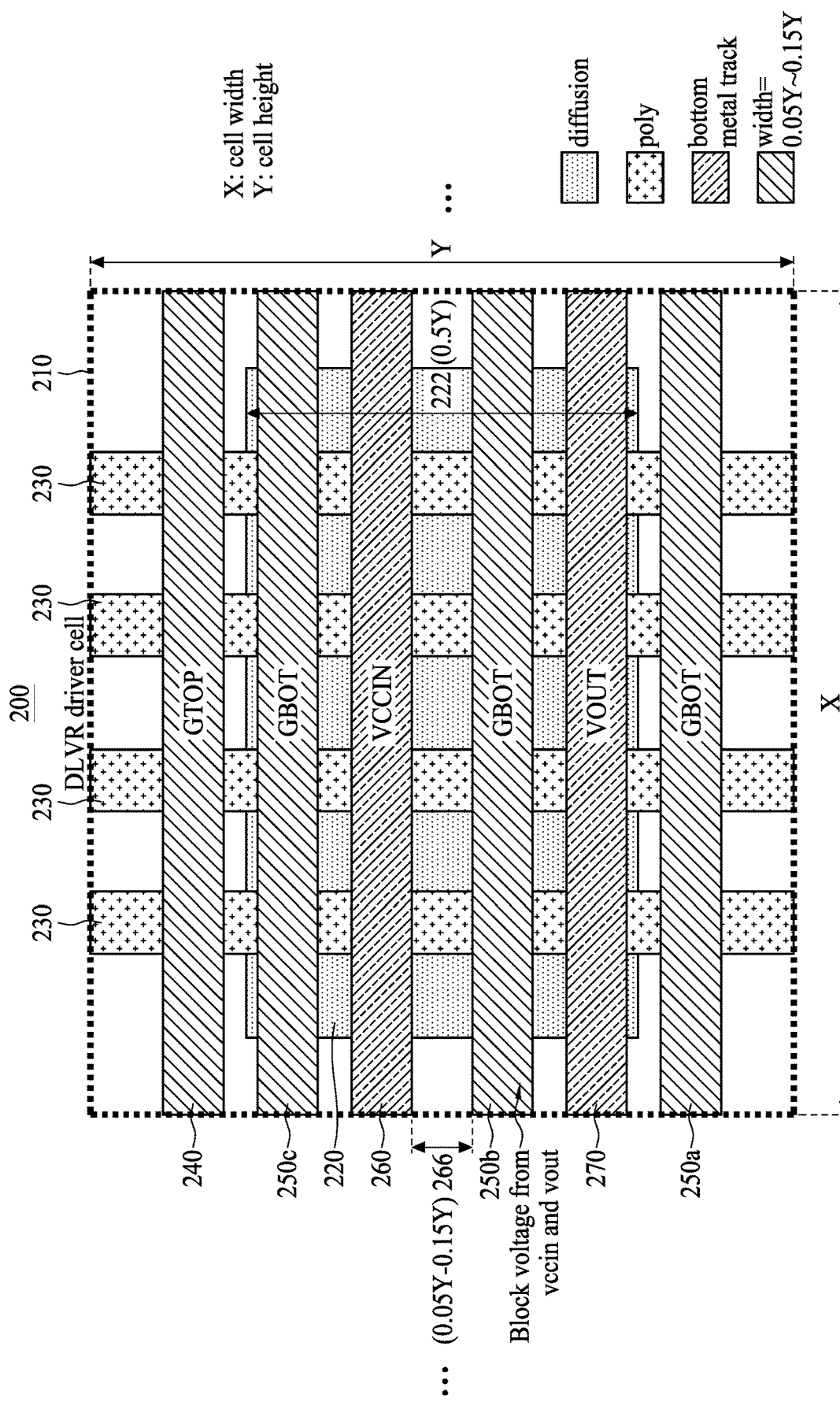
FIG. 2 schematically shows the active layer and the bottom metal layer of a digital low-dropout voltage regulator (DLVR) contained within a functional cell in an integrated circuit device according to some embodiments.

In certain other embodiments, such as the one shown in FIG. 2, multiple conductive lines are connected to each other and to respective common terminals. In this example, a DLVR cell 210 includes a diffusion region 220, with a height 222 that is substantially smaller than the height Y of the cell it resides in. For example, the height 222 of diffusion region can be between 35-65% of the cell height Y in some embodiments, between 40-60% in certain other embodiments, between 45-55% in certain other embodiments, and approximately 50% in certain other embodiments. The diffusion region 220 includes multiple segments, each of which corresponding to a transistor P1-P8. The transistors in some embodiments are MOSFETs, including finFETs or planar MOSFETs. The DLVR cell 210 in some embodiments further includes gate lines 230, disposed above the diffusion region 220 as described above in reference to FIG. 1B. The DLVR cell 110 in some embodiments further includes multiple (in this example, six) conductive (e.g., metallic) lines 240, 250a, 250b, 250c, 260, 270 disposed in a first conductive layer MA above the gate lines 230 and within the cell height Y.

The DLVR cell 210 in FIG. 2 is otherwise similar to the DLVR cell 110 in FIG. 1B, except that there are three reference voltage lines 250a, 250b, 250c in the DLVR cell 210 as opposed to a single reference voltage line 250 in the DLVR cell 110. The three reference voltage lines 250a, 250b, 250c in this example are connected to each other by one or more conductive lines in conductive (metallic) layers above (not shown) the first conductive layer. One of the conductive lines 250b is interposed between the power supply line 260 and the output line 270. This intervening conductive line 250b, biased at a voltage between 0 and VCCIN (e.g., 0.5×VCCIN), permits the conductive line 250b to be placed closer to the voltage supply line 260 then the minimum spacing between the voltage supply line 260 and output line 270 without any intervening conductive line. In this example, with the reference voltage line 250b to be biased at 0.5×VCCIN, the spacing 266 between the voltage supply line 260 and the reference voltage line 250b can range between 0.05Y and 0.15Y.

Figure 3:
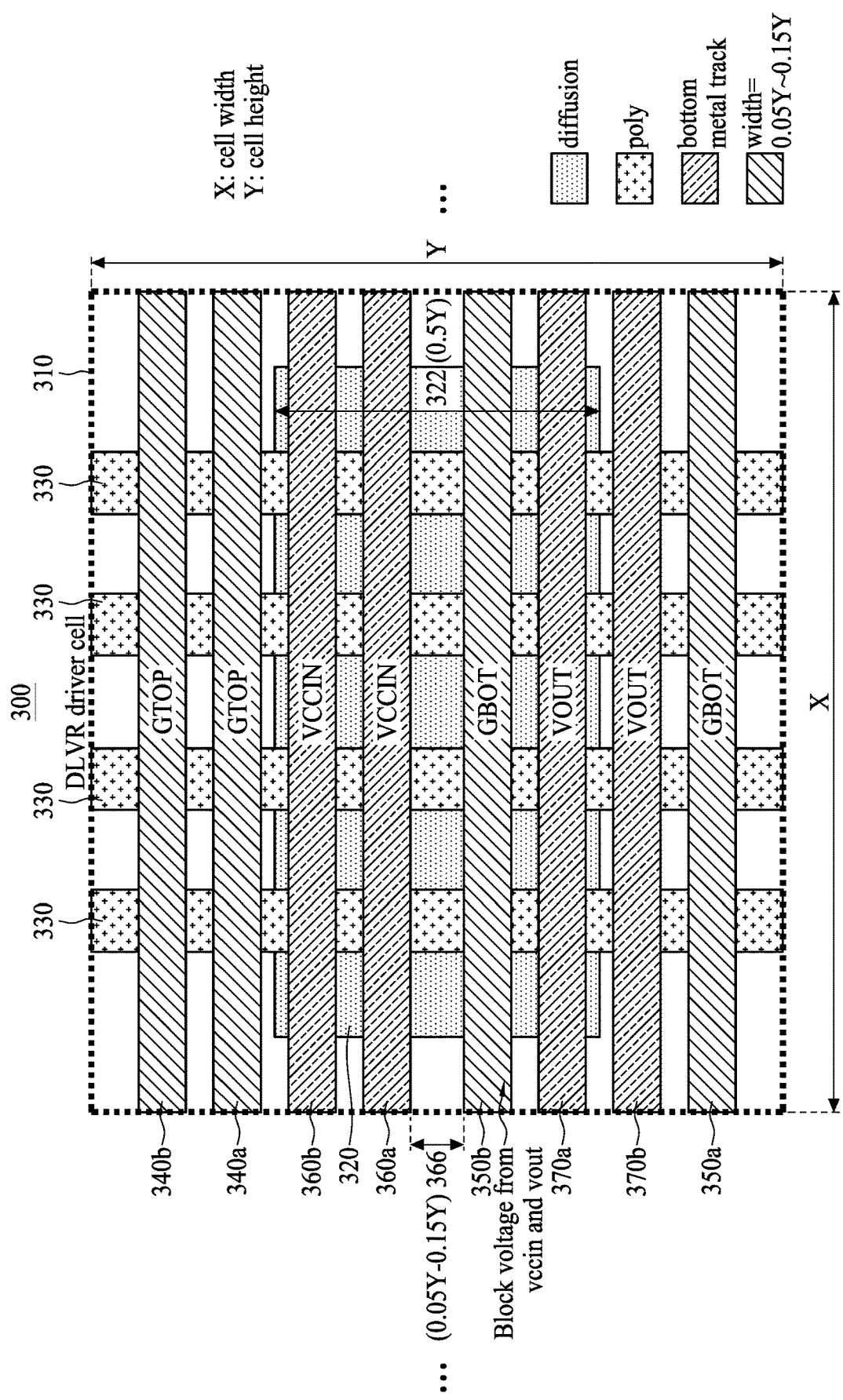
FIG. 3 schematically shows the active layer and the bottom metal layer of a digital low-dropout voltage regulator (DLVR) contained within a functional cell in an integrated circuit device according to some embodiments.

In certain other embodiments, such as the one shown in FIG. 3, multiple conductive lines are connected to each other and to respective common terminals. In this example, a DLVR cell 310 includes a diffusion region 320, with a height 322 that is substantially smaller than the height Y of the cell it resides in. For example, the height 322 of diffusion region can be between 35-65% of the cell height Y in some embodiments, between 40-60% in certain other embodiments, between 45-55% in certain other embodiments, and approximately 50% in certain other embodiments. The diffusion region 320 includes multiple segments, each of which corresponding to a transistor P1-P8. The transistors in some embodiments are MOSFETs, including finFETs or planar MOSFETs. The DLVR cell 310 in some embodiments further includes gate lines 330, disposed above the diffusion region 320 as described above in reference to FIG. 1B. The DLVR cell 310 in some embodiments further includes multiple (in this example, eight) conductive (e.g., metallic) lines 240a, 240b, 250a, 250b, 260a, 260b, 270a, 270b disposed in a first conductive layer MA above the gate lines 330 and within the cell height Y.

The DLVR cell 310 in FIG. 3 is otherwise similar to the DLVR cell 110 in FIG. 1B, except that there are duplicate input lines 340a, 340b, reference voltage lines 350a, 350, voltage supply lines 360a, 360b, and output lines 370a, 370b in the DLVR cell 310 as opposed to a single conductive lines 140, 150, 160, 170 in the DLVR cell 110. Each pair of the conductive lines (340a, b), (350a, b), (360a, b), (370a, b) in this example are connected to each other by one or more conductive lines in conductive (metallic) layers above (not shown) the first conductive layer. Similar to the DLVR cell 210 in FIG. 2, one of the conductive lines 350b is interposed between the power supply line 360a and the output line 370a. This intervening conductive line 350b, biased at a voltage between 0 and VCCIN (e.g., 0.5×VCCIN), permits the conductive line 350b to be placed closer to the voltage supply line 260a then the minimum spacing between the voltage supply line 360a and output line 370a without any intervening conductive line. In this example, with the reference voltage line 350b to be biased at 0.5×VCCIN, the spacing 366 between the voltage supply line 360a and the reference voltage line 350b can range between 0.05Y and 0.15Y.

Figure 4:
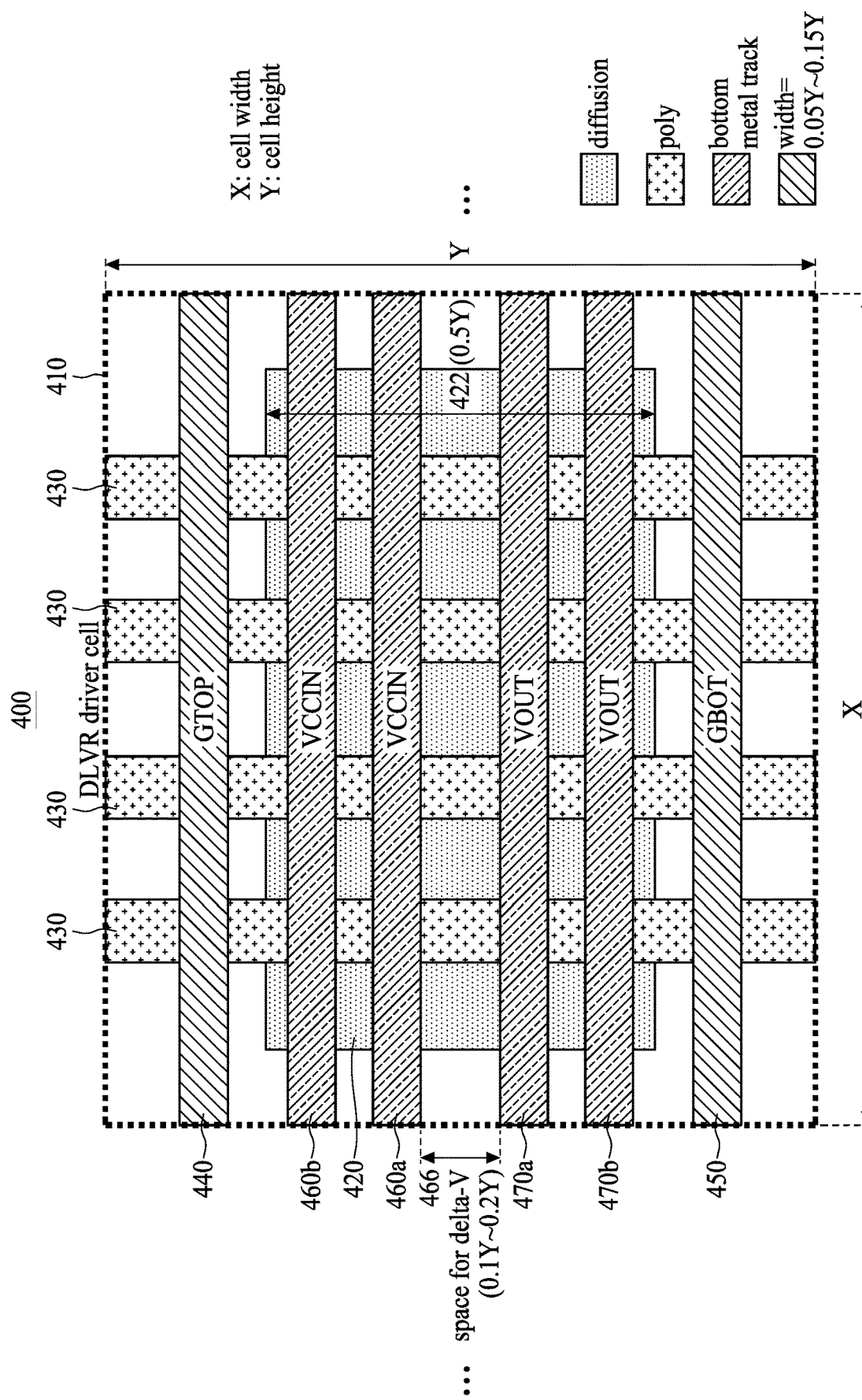
FIG. 4 schematically shows the active layer and the bottom metal layer of a digital low-dropout voltage regulator (DLVR) contained within a functional cell in an integrated circuit device according to some embodiments.

In certain other embodiments, such as the one shown in FIG. 4, multiple conductive lines are connected to each other and to respective common terminals. In this example, a DLVR cell 410 includes a diffusion region 420, with a height 422 that is substantially smaller than the height Y of the cell it resides in. For example, the height 422 of diffusion region can be between 35-65% of the cell height Y in some embodiments, between 40-60% in certain other embodiments, between 45-55% in certain other embodiments, and approximately 50% in certain other embodiments. The diffusion region 420 includes multiple segments, each of which corresponding to a transistor P1-P8. The transistors in some embodiments are MOSFETs, including finFETs or planar MOSFETs. The DLVR cell 410 in some embodiments further includes gate lines 430, disposed above the diffusion region 420 as described above in reference to FIG. 1B. The DLVR cell 410 in some embodiments further includes multiple (in this example, six) conductive (e.g., metallic) lines 440, 450, 460a, 460b, 470a, 470b disposed in a first conductive layer MA above the gate lines 330 and within the cell height Y.

The DLVR cell 410 in FIG. 4 is otherwise similar to the DLVR cell 110 in FIG. 1B, except that there are duplicate voltage supply lines 360a, 360b and output lines 370a, 370b in the DLVR cell 410 as opposed to a single conductive lines 160, 170 in the DLVR cell 110. Each pair of the conductive lines (360a, b), (370a, b) in this example are connected to each other by one or more conductive lines in conductive (metallic) layers above (not shown) the first conductive layer. Similar to the DLVR cell 110 in FIG. 1B, there is no conductive line intervening the power supply line 460a and the output line 470a. The spacing 466 between the voltage supply line 460a and the output line 470a thus range between 0.1Y and 0.2Y, the same as for the DLVR cell 110 in FIG. 1B.

The examples described above, with the conductive lines positioned within the cell height of the unit cell, and with at least one voltage supply line and at least one output line disposed directly above the diffusion region, permit opportunities for optimized routing of power supply lines. For example, in some embodiments, as shown in FIGS. 5A and 5B, conductive paths can be constructed with "stacked" vias, i.e., with vias associate with different conductive layers in the conductive structure (sometimes referred to as "back end of line") that interconnects various devices in an integrated circuit device positioned substantially directly on top of each other.

Figure 5B:
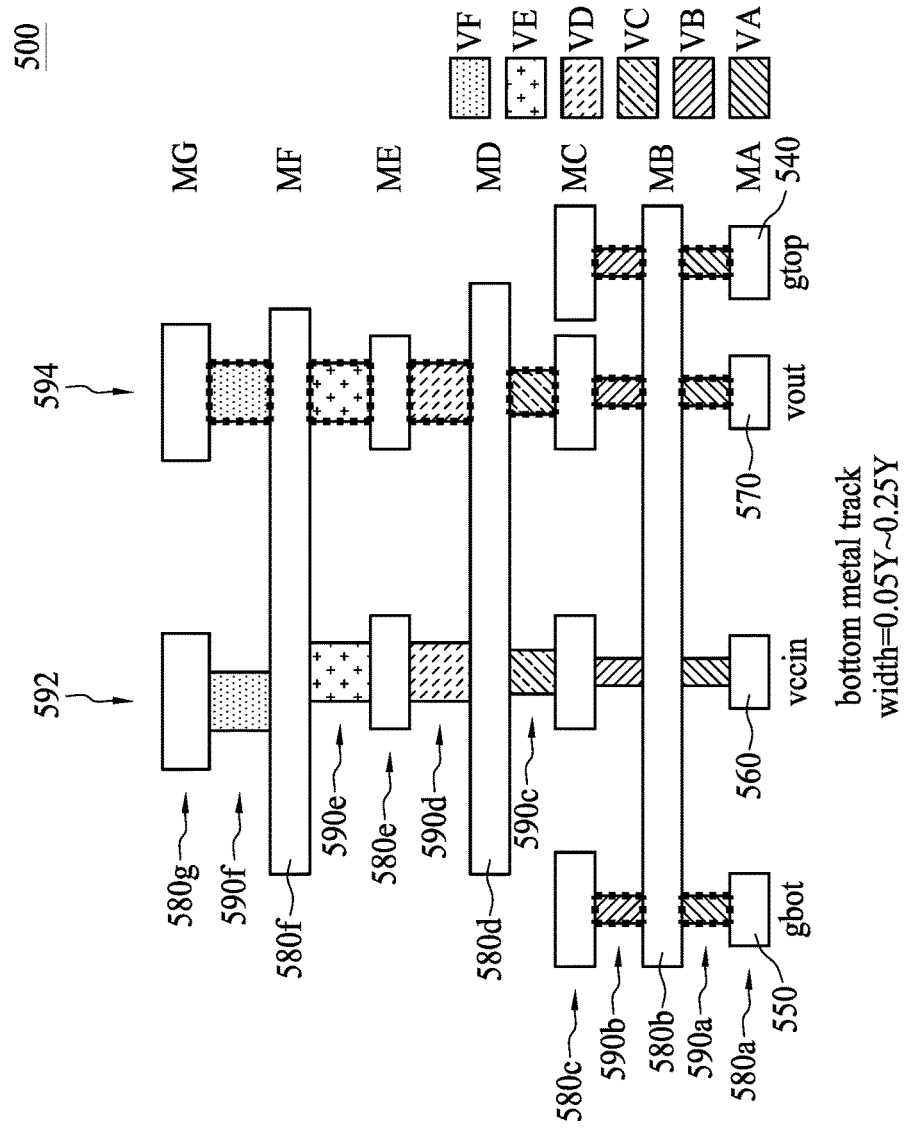
FIG. 5B schematically illustrates a cross-sectional view of the back end (BE) off a digital low-dropout voltage regulator (DLVR) according to some embodiments; the VIAs in five players for the voltage input (VCCIN) are vertically aligned, as are the VIAs in the five players for the voltage output (VOUT), in this example.
Figure 5A:
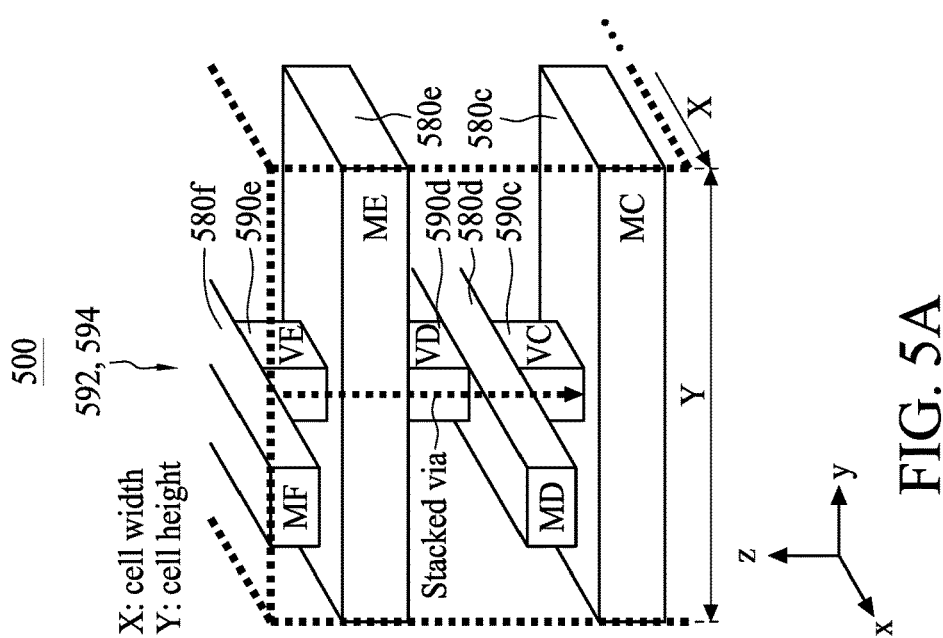
FIG. 5A schematically illustrates a three-dimensional view of a portion of the back end (BE) of a digital low-dropout voltage regulator (DLVR) according to some embodiments; VIAs in different layers in this example are vertically aligned.

Thus, in some embodiments, as illustrated in FIGS. 5A and 5B, additional layers of conductive lines 580b, 580c, 580d, 580e, 580f, 580g are disposed above the first conductive layer 580a and are interconnected by vias 590a, 590b, 590c, 590d, 590e, 590f. A conductive path (voltage supply path 592) between a conductive line 580g in the top layer and the voltage supply line 560 is formed by at least one conductive line 580b, 580c, 580d, 580e, 580f from each layer intervening the top and first layer and vias 590a, 590b, 590c, 590d, 590e, 590f interconnecting the respective conductive lines in neighboring layers. At least a second conductive path (output path 594) between a conductive line in the top one of the layers of conductive lines 580g and the output line 570 is similarly formed. In some embodiments, the vias in each voltage supply path 592 overlap each other when viewed along a direction (z-direction) substantially perpendicular to the layers of conductive lines; likewise, the vias in the output path 594 overlap each other when viewed along a direction (z-direction) substantially perpendicular to the layers of conductive lines. In some embodiments, the vias in at least a substantial portion (such as at least four or five layers) of each of the conductive paths completely are substantially aligned with each other a long a common axis. In the example in FIG. 5B, at least the vias 590a, 590b, 590c, 590d, 590e in each conductive path 592, 594 are aligned along the z-direction. In some embodiments, cross-sectional dimensions of the vias in each of the conductive paths monotonically increase or remain the same from the lower layers of conductors to the higher layers of conductors. For example, the cross-sectional sizes of the vias 590a, 590b, 590c, 590d, 590e in each conductive path 592, 594 progressively increase, or at least do not decrease, with layers further removed from the diffusion region.

The structure of "stacked" vias in some embodiment results in low ON-resistance ($R_{ON}$) of DLVRs and improved electromigration performance (EM<50%). Stacked via structure also reduce parasitic effects per driver cell due at least in part to a more compact conductive structure.

Figure 6:
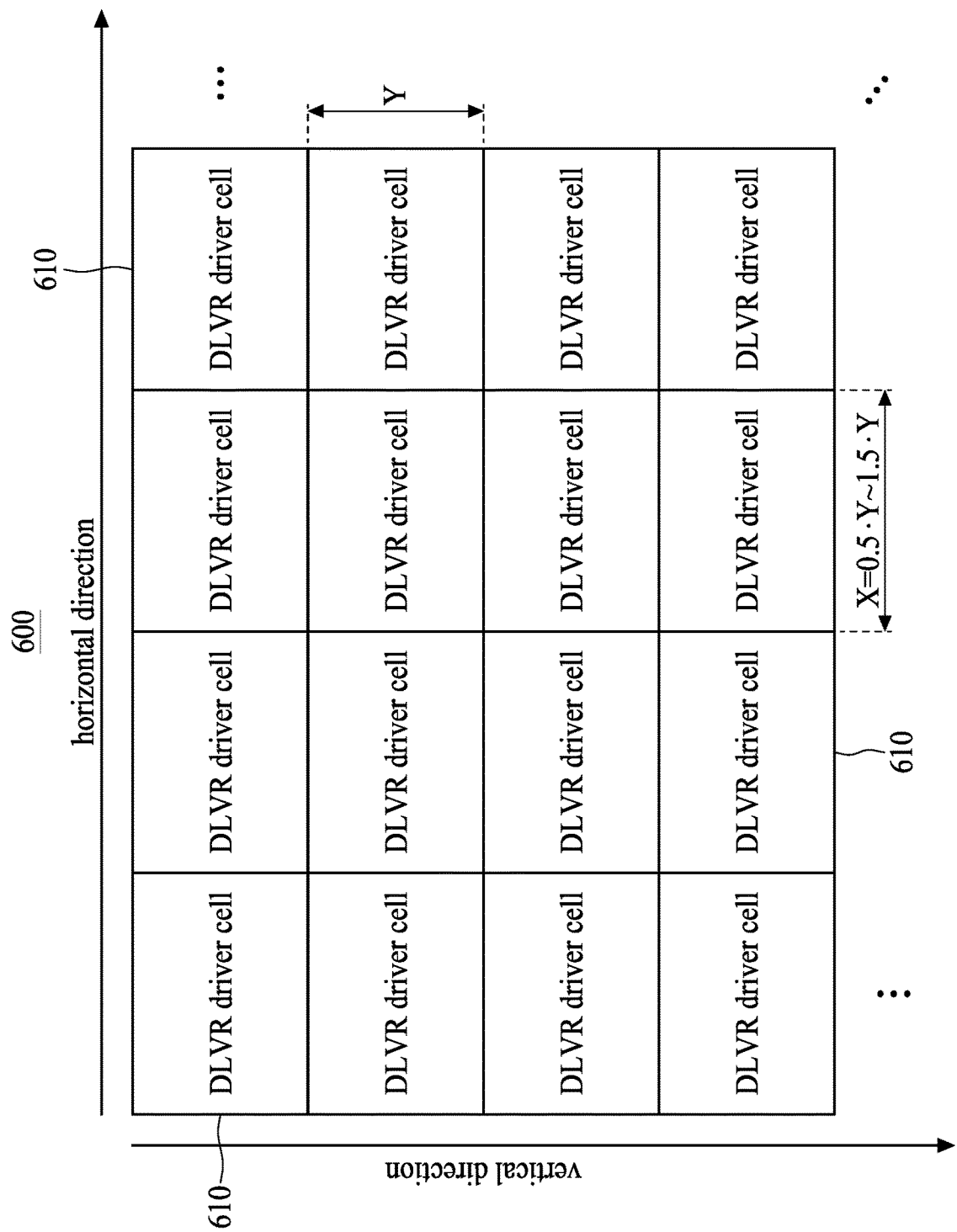
FIG. 6 schematically shows a two-dimensional array of digital low-dropout voltage regulators (DLVRs) according to some embodiments.

In certain other embodiments, as shown in FIG. 6, an integrated circuit device 600 includes multiple DLVR cells 610 described above arranged in rows and columns. In some embodiments, each of the DLVR cells 610 has an aspect ratio. In some embodiments, the aspect ratio ranges from 0.5 to 1.5. Proper choice of the aspect ratio in some embodiments results in optimized area efficiency. In some embodiments, square (i.e., an aspect ratio of 1) DLVR cells are used. The DLVR cells 610 are interconnected to provide output voltages and current capacity as desired. In some embodiments identical DLVR cells 610 are used to form the DLVR cell array. Because the backend routing for each DLVR cell 610 is repeatable, DLVR cells can be combined into an array with relative ease.

Figure 7:
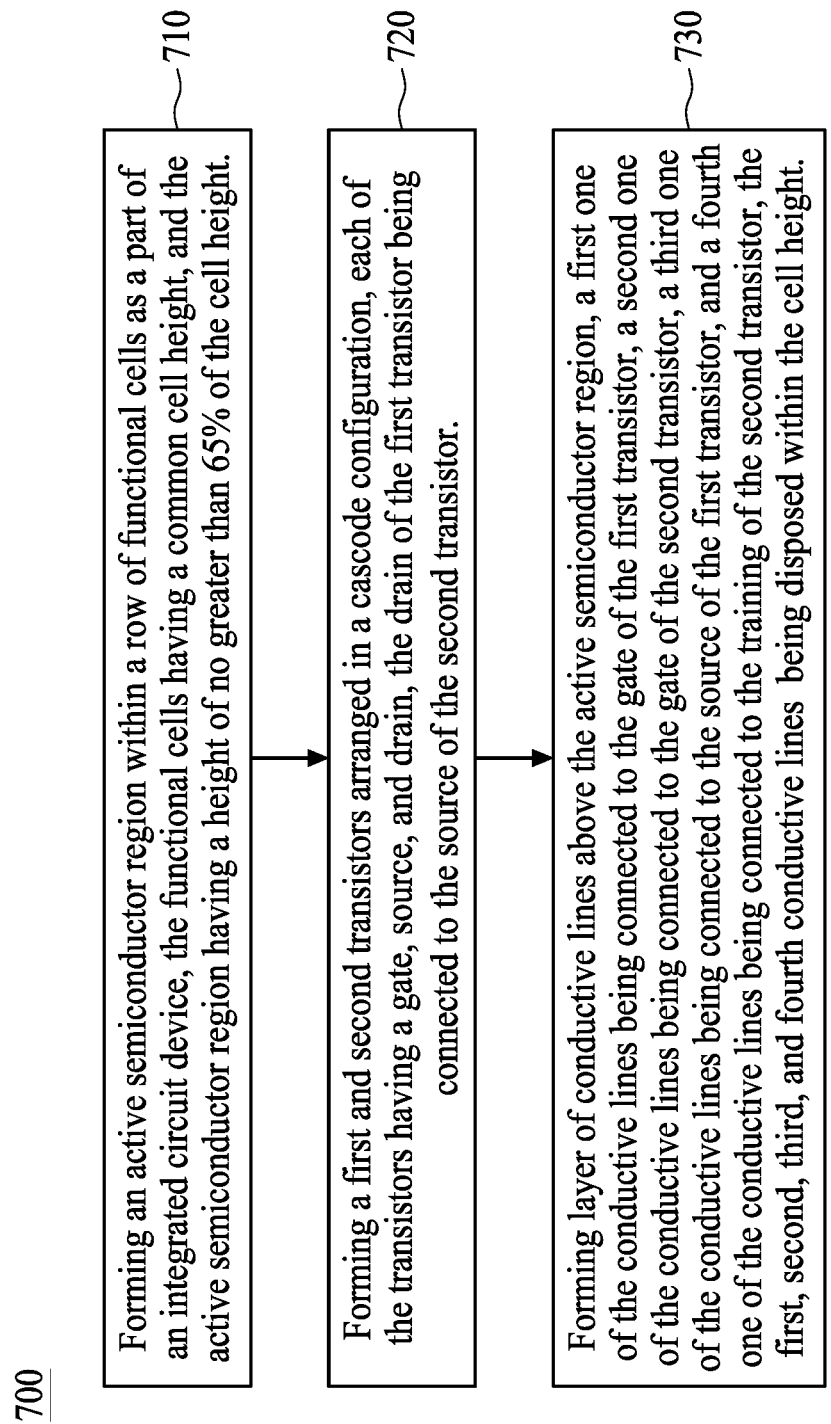
FIG. 7 outlines a process of making a digital low-dropout voltage regulator according to some embodiments.

In certain other embodiments, as outlined in FIG. 7, a process of making a digital low-dropout voltage regulator includes: forming (710) an active semiconductor region within a row of functional cells as a part of an integrated circuit device, the functional cells having a common cell height, and the active semiconductor region having a height of no greater than 65% of the cell height; forming (720) a first and second transistors arranged in a cascode configuration, each of the transistors having a gate, source, and drain, the drain of the first transistor being connected to the source of the second transistor; and forming (730) a layer of conductive lines above the active semiconductor region, a first one of the conductive lines being connected to the gate of the first transistor, a second one of the conductive lines being connected to the gate of the second transistor, a third one of the conductive lines being connected to the source of the first transistor, and a fourth one of the conductive lines being connected to the training of the second transistor, the first, second, third, and fourth conductive lines being disposed within the cell height.

The embodiments disclosed herein, including the sizing and/or arrangement of conductive lines within the height of functional cells (such as standard cells), facilitate flexible integration of DLVRs into integrated circuit devices. The flexibility offered by the DLVR cell design enables to easy placement of DLVR cells of different regulated voltages (e.g., 1.98 V and 1.65 V) with appropriate voltage domains, thereby achieving a more desirable power, performance and area (PPA) combination. Additionally, the placement of first layer conductive lines within the functional cell height, together with backend stacked-via design, minimize the ON-resistance ($R_{ON}$) of the DLVR, thereby increasing the current capacity of the DLVR, as well as reducing electron-migration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
 a plurality rows of functional cells, each of the plurality of rows extending in a direction and having a cell height transverse to the direction in which the rows extend, at least one of the rows of functional cells comprising at least one digital low-dropout voltage regulator (DLVR) cell with the cell height for the row, the at least one DLVR cell comprising:
 an input terminal;
 a reference voltage terminal;
 a voltage supply terminal;
 an output terminal; and
 one or more pairs of first and second transistors arranged in cascode configuration connected between the voltage supply terminal and output terminal, each of the transistors having a gate, source and drain, the gate of the first one of transistor in each pair being connected to the voltage supply terminal connected to the input terminal, and the gate of the second transistor in each pair being connected to the reference voltage terminal.

2. The integrated circuit device of claim 1, having an active semiconductor layer and a layer of conductive lines disposed above the active semiconductor layer, wherein:
the one or more pairs of first and second transistors are formed in the active semiconductor layer and define a diffusion region having a height of no greater than about 65% of the cell height,
the input terminal comprises a first conductive line in the first layer of conductive lines,
the reference voltage terminal comprises a second conductive line in the first layer of conductive lines,
the voltage supply terminal comprises a third conductive line in the first layer of conductive lines, and
the output terminal comprises a fourth conductive line in the first layer of conductive lines,
wherein the first, second, third and fourth conductive lines are located within the cell height.

3. The integrated circuit device of claim 2, wherein the first, second, third and fourth conductive lines are parallel to each other and extend in the direction along which the rows extend, wherein at least the third and fourth conductive lines are disposed directly above the diffusion region.

4. The integrated circuit device of claim 3, wherein:
the input terminal consists of the first conductive line in the first layer of conductive lines,
the reference voltage terminal consists of the second conductive line in the first layer of conductive lines,
the voltage supply terminal consists of the third conductive line in the first layer of conductive lines, and
the output terminal consists of the fourth conductive line in the first layer of conductive lines.

5. The integrated circuit device of claim 3, wherein:
the input terminal consists of the first conductive line in the first layer of conductive lines,
the reference voltage terminal consists of:
the second conductive line in the first layer of conductive lines; and
a fifth and a sixth conductive lines in the first layer of conductive lines,
the voltage supply terminal consists of the third conductive line in the first layer of conductive lines,
the output terminal consists of the fourth conductive line in the first layer of conductive lines.

6. The integrated circuit device of claim 5, wherein one of the second, fifth and sixth conductive lines is disposed between the third and fourth conductive lines.

7. The integrated circuit device of claim 5, wherein one of the second and sixth conductive lines is disposed between, and adjacent, the third and fourth conductive lines.

8. The integrated circuit device of claim 3, wherein:
the input terminal consists of the first and a fifth conductive lines in the first layer of conductive lines,
the reference voltage terminal consists of the second and a sixth conductive lines in the first layer of conductive lines;
the voltage supply terminal consists of the third and a seventh conductive lines in the first layer of conductive lines,
the output terminal consists of the fourth and an eighth conductive lines in the first layer of conductive lines.

9. The integrated circuit device of claim 3, wherein:
the input terminal consists of the first conductive line in the first layer of conductive lines,
the reference voltage terminal consists of the second conductive line in the first layer of conductive lines;
the voltage supply terminal consists of the third and a fifth conductive lines in the first layer of conductive lines,
the output terminal consists of the fourth and a sixth conductive lines in the first layer of conductive lines.

10. The integrated circuit device of claim 9, wherein one of the third and fifth conductive lines is adjacent one of the fourth and sixth conductive lines.

11. The integrated circuit device of claim 2, further comprising:
a plurality of layers of conductive lines above the first layer of conductive lines; and
a plurality of conductive pillars, each interconnecting one of the conductive lines in one of the plurality of layers of conductive lines with one of the conductive lines in another one of the plurality of layer of conductive lines or the first layer of conductive lines,
wherein the plurality of layer of conductive lines and plurality of conductive pillars are configured to form at least a first conductive path between a first conductive line in a top one of the plurality of layers of conductive lines and the third conductive line, the first conductive path comprising at least one first conductive line from each of the plurality of layers of conductive line intervening the top and first layers and at least a first subset of the plurality of vi conductive pillars interconnecting the respective conductive lines in neighboring layers,
wherein at least a subset of the conductive pillars in the first conductive path are aligned with each other in a direction substantially perpendicular to the first layer of conductive lines.

12. The integrated circuit device of claim 11, wherein the conductive pillars in first conductive path are disposed within a space directly above the DLVR cell.

13. The integrated circuit device of claim 2, wherein the one or more pairs of first and second transistors are formed in the active semiconductor layer and define a diffusion region having a height of no less that about 40%, and no greater than about 60% of the cell height.

14. An integrated circuit device, comprising:
an active semiconductor layer defining a plurality of functional units, including a at least one digital low-dropout voltage regulator (DLVR) cell comprising a DLVR circuit having a voltage supply input and an output;
a first layer of conductive lines disposed above the DLVR circuit, a first one of the conductive lines being connected to the voltage supply input, and a second one of the conductive lines being connected to the output; and
a plurality of layers of conductive lines above the first layer of conductive lines; and
a plurality of conductive pillars, each interconnecting one of the conductive lines in one of the plurality of layers of conductive lines with one of the conductive lines in another one of the plurality of layer of conductive lines or the first layer of conductive lines.

15. The integrated circuit device of claim 14, wherein the plurality of layer of conductive lines and plurality of conductive pillars are further configured to form at least a second conductive path between a second conductive line in the top one of the plurality of layers of conductive lines and the second conductive line, the second conductive path comprising at least a second one of the conductive lines from each of the plurality of layers of conductive line intervening the top and first layers and at least a second subset of the plurality of conductive pillars interconnecting the respective conductive lines in neighboring layers, wherein at least a subset of the conductive pillars in the second conductive path are aligned with each other in a direction substantially perpendicular to the first layer of conductive lines.

16. The integrated circuit device of claim 15, wherein the conductive pillars in first conductive path and second conductive path are disposed within a space directly above the DLVR cell.

17. A method of making an integrated circuit device, the method comprising:
forming an active semiconductor region within a row of functional cells as a part of an integrated circuit device, the functional cells having a common cell height;
forming a first and second transistors in the active semiconductor region, the first and second transistors being arranged in a cascode configuration, each of the transistors having a gate, source, and drain, the drain of the first transistor being connected to the source of the second transistor; and
forming a first layer of conductive lines above the active semiconductor region, a first one of the conductive lines being connected to the gate of the first transistor, a second one of the conductive lines being connected to the gate of the second transistor, a third one of the conductive lines being connected to the source of the first transistor, and a fourth one of the conductive lines being connected to the drain of the second transistor, the first, second, third, and fourth conductive lines being disposed within the cell height.

18. The method of claim 17, further comprising:
forming a plurality of layers of conductive lines above the first layer of conductive lines;
forming a plurality of conductive pillars, each of which interconnecting one of the conductive lines in one of the layers of conductive lines to one of the conductive lines in another one of the layers of conductive lines; and
configure the plurality of layers of conductive lines and plurality of conductive pillars to form a first conductive path between a first conductive line in a top one of the plurality of layers of conductive lines and the third conductive line, such that at least a subset of the conductive pillars in the first conductive path are aligned with each other in a direction substantially perpendicular to the first layer of conductive lines.

19. The method of claim 18, further comprising configure the plurality of layers of conductive lines and plurality of conductive pillars to form a second conductive path between a second conductive line in the top one of the plurality of layers of conductive lines and the fourth conductive line, such that at least a subset of the conductive pillars in the second conductive path are aligned with each other in a direction substantially perpendicular to the first layer of conductive lines.

20. The method of claim 17, wherein forming a first layer of conductive lines further comprises disposing a fifth one of the conductive lines in the first layer of conductive lines between the third and fourth conductive lines, and interconnecting the second and fifth conductive lines.

* * * * *